(12) United States Patent
Ai et al.

(10) Patent No.: US 12,507,479 B2
(45) Date of Patent: Dec. 23, 2025

(54) ARRAY SUBSTRATE AND DISPLAY PANEL

(71) Applicant: WUHAN CHINA STAR OPTOELECTRONICS TECHNOLOGY CO., LTD., Hubei (CN)

(72) Inventors: Fei Ai, Hubei (CN); Dewei Song, Hubei (CN); Shiyu Long, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 675 days.

(21) Appl. No.: 17/905,175

(22) PCT Filed: Aug. 17, 2022

(86) PCT No.: PCT/CN2022/112994
§ 371 (c)(1),
(2) Date: Aug. 28, 2022

(87) PCT Pub. No.: WO2024/026935
PCT Pub. Date: Feb. 8, 2024

(65) Prior Publication Data
US 2024/0204000 A1 Jun. 20, 2024

(30) Foreign Application Priority Data
Aug. 3, 2022 (CN) .......................... 202210927791.7

(51) Int. Cl.
*H10D 86/60* (2025.01)
*H10D 86/40* (2025.01)

(52) U.S. Cl.
CPC ........... *H10D 86/60* (2025.01); *H10D 86/421* (2025.01)

(58) Field of Classification Search
CPC .. H10D 86/60; H10D 86/421; H10D 30/6757; G02F 1/1368
See application file for complete search history.

(56) References Cited

U.S. PATENT DOCUMENTS

| | | | |
|---|---|---|---|
| 6,768,156 B1 * | 7/2004 | Bhattacharyya | H10D 30/751 257/314 |
| 2014/0159037 A1 | 6/2014 | Kwon et al. | |

FOREIGN PATENT DOCUMENTS

| | | |
|---|---|---|
| CN | 104362179 A | 2/2015 |
| CN | 106298957 A | 1/2017 |

(Continued)

OTHER PUBLICATIONS

International Search Report in International application No. PCT/CN2022/112994, mailed on Dec. 21, 2022.

(Continued)

*Primary Examiner* — Elias Ullah
(74) *Attorney, Agent, or Firm* — PV IP PC; Wei Te Chung

(57) ABSTRACT

An array substrate and a display panel are provided. The array substrate includes an active layer. The active layer includes a channel portion and a doped portion. The doped portion includes a first doped layer and a second doped layer. The channel portion includes a first channel portion and a second channel portion. The first channel portion is connected to the first doped layer. The second channel portion is connected to the second doped layer. A part of the second channel portion overlaps with a part of the first doped layer, thus, a step-laminated structure is formed, and an overall performance of the device is improved.

19 Claims, 6 Drawing Sheets

(56) References Cited

FOREIGN PATENT DOCUMENTS

| CN | 107093557 A | 8/2017 |
| CN | 107154407 A | 9/2017 |
| CN | 107425075 A | 12/2017 |
| CN | 108198864 A | 6/2018 |
| CN | 110972508 A | 4/2020 |
| CN | 114122148 A | 3/2022 |

OTHER PUBLICATIONS

Written Opinion of the International Search Authority in International application No. PCT/CN2022/112994, mailed on Dec. 21, 2022.

Chinese Office Action issued in corresponding Chinese Patent Application No. 202210927791.7 dated May 1, 2025, pp. 1-7.

* cited by examiner

ARRAY SUBSTRATE AND DISPLAY PANEL

FIELD OF INVENTION

The present application relates to a field of display technology, and in particular, to an array substrate and a display panel.

BACKGROUND OF INVENTION

In display panels, low temperature polysilicon thin film transistors are key components in active driving and peripheral circuits in display devices such as liquid crystal display (LCD) and organic light emitting diode (OLED). In order to improve a performance of the thin film transistor, in the prior art, structures such as lightly doped drain electrode and raised source-drain electrode are usually formed inside the thin film transistor. A stability and a reliability of thin-film transistor devices are improved by structures of the lightly doped drain electrode and the raises source-drain electrode. Therefore, the device manufactured by the above structure can improve a performance of the thin film transistor to a certain extent. However, the above structure will additionally introduce a new series resistance structure. The series resistance structure easily leads to a decrease in the on-state current inside the thin film transistor, while the off-state leakage current is high, which affects a performance of the thin film transistor and is not conducive to an overall improvement of performance of the thin film transistor.

Therefore, it is necessary to propose solutions to the problems in the prior art.

To sum up, in the currently display panel, the on-state current of the thin film transistor inside the display panel is low and the off-state leakage current is high, which is not conducive to further improvement of an overall performance of the display panel.

SUMMARY OF INVENTION

In order to solve the above-mentioned problem, embodiments of the present application provide an array substrate and a display panel. In order to effectively improve the on-state current and off-state leakage current of the thin film transistor inside the display panel, and improve the overall performance of the device.

In order to solve the above technical problems, the present application provides an array substrate, which includes a display region and a non-display region positioned on one side of the display region, wherein the array substrate includes:

a substrate;
an active layer disposed on the substrate, wherein the active layer includes a channel portion and doped portions disposed on two sides of the channel portion;
wherein the doped portion includes a first doped layer and a second doped layer, wherein the second doped layer is positioned on the first doped layer and overlaps with the first doped layer; and
wherein the channel portion includes a first channel portion, and a second channel portion positioned on the first channel portion and connected to the first channel portion, wherein the first channel portion is connected to the first doped layer, wherein the second channel portion is connected to the second doped layer, and wherein a part of the second channel portion overlaps with a part of the first doped layer; and
wherein a length of the first channel portion is longer than a length of the second channel portion.

According to one embodiment of the present application, the present application provides an array substrate, which includes a display region and a non-display region positioned on one side of the display region, wherein the array substrate includes:

a substrate;
an active layer disposed on the substrate, wherein the active layer includes a channel portion and doped portions disposed on two sides of the channel portion;
wherein the doped portion includes a first doped layer and a second doped layer, wherein the second doped layer is positioned on the first doped layer and overlaps with the first doped layer; and
wherein the channel portion includes a first channel portion, and a second channel portion positioned on the first channel portion and connected to the first channel portion, wherein the first channel portion is connected to the first doped layer, wherein the second channel portion is connected to the second doped layer, and wherein a part of the second channel portion overlaps with a part of the first doped layer.

According to one embodiment of the present application, an edge of the first doped layer on a side away from the channel portion and an edge of the second doped layer on a side away from the channel portion are flush, wherein a length of the first doped layer is greater than a length of the second doped layer.

According to one embodiment of the present application, a side edge of the first doped layer close to the channel portion is connected to the first channel portion and the second channel portion.

According to one embodiment of the present application, a thickness of a film corresponding to the first channel portion is the same as a thickness of a film corresponding to the second channel portion.

According to one embodiment of the present application, a thickness of one terminal of the first doped layer close to the first channel portion is equal to a thickness of the first channel portion, wherein a thickness of one terminal of the second doped layer close to the second channel portion is equal to a thickness of the second channel portion.

According to one embodiment of the present application, the first doped layer includes a stacked portion and an extension portion connected to the stacked portion, wherein the stacked portion overlaps with the second doped layer, wherein the extension portion extends beyond the second doped layer and is connected to the first channel portion, and wherein the extension portion is disposed overlapping with the second channel portion.

According to one embodiment of the present application, the lengths of the extension portions positioned on both sides of the first channel portion are the same.

According to one embodiment of the present application, a length of the extension portion positioned on either side of the first channel portion is smaller than a length of a corresponding second channel portion.

According to one embodiment of the present application, a length of the extension portion positioned on either side of the first channel portion ranges from 0.5 um to 1 um.

According to one embodiment of the present application, the first doped layer includes a first sublayer close to the channel portion, and a second sublayer relatively far from the channel portion, wherein the first sublayer is connected to the second sublayer, and wherein a distance between the first sublayer and the substrate is greater than a distance between the second sublayer and the substrate;
  wherein the second doped layer includes a third sublayer close to the channel portion, and a fourth sublayer relatively far from the channel portion, wherein the third sublayer is connected to the fourth sublayer, and wherein a distance between the third sublayer and the substrate is greater than a distance between the fourth sublayer and the substrate.

According to one embodiment of the present application, the third sublayer partially overlaps the first sublayer, wherein the fourth sublayer partially overlaps the second sublayer.

According to one embodiment of the present application, a thickness of the first sublayer is the same as a thickness of the second sublayer, and wherein a thickness of the third sublayer is the same as a thickness of the fourth sublayer.

According to one embodiment of the present application, the array substrate further includes a light shielding layer disposed on the substrate, and an insulating medium layer disposed on the substrate and covering the light shielding layer, wherein the light shielding layer and the insulating medium layer are both positioned between the substrate and the active layer;
  wherein the insulating medium layer includes a raised portion on the light shielding layer, and a flat portion connected to the raised portion, and wherein a distance between the raised portion and the substrate is greater than a distance between the flat portion and the substrate; and
  wherein the first sublayer is arranged to overlap with the raised portion, and wherein the second sublayer is arranged to overlap with the flat portion.

According to one embodiment of the present application, the array substrate further includes:
  a gate electrode disposed on the active layer; and,
  a source/drain metal layer disposed on the gate electrode and is electrically connected to the active layer, and wherein the light shielding layer is also electrically connected to the gate electrode through a through hole.

According to one embodiment of the present application, the gate electrode is correspondingly disposed on the channel portion of the active layer, and wherein an orthographic projection of the gate electrode on the substrate is at least coinciding with an orthographic projection of the first doped layer on the substrate.

According to one embodiment of the present application, a side edge of the orthographic projection of the gate electrode on the active layer coincides with a side edge of the second doped layer close to the second channel portion.

According to one embodiment of the present application, the first doped layer is a lightly doped layer, and wherein the second doped layer is a heavily doped layer.

According to a second aspect of the embodiments of the present application, the present application also provides a display panel including the above-mentioned array substrate.

To sum up, the beneficial effects of the embodiments of the present application are:

The embodiments of the present application provide an array substrate and a display panel. The array substrate includes an active layer, wherein the active layer includes a channel portion and a doped portion. The doped portion includes a first doped portion and a second doped portion overlapping the first doped portion. The channel portion includes a first channel portion and a second channel portion connected to the first channel portion. The first channel portion is connected to the first doped layer, and the second channel portion is connected to the second doped layer. A portion of the second channel portion overlaps with a portion of the first doped layer, thus, a stepped structure is formed. The formed step structure changes an electric field distribution in the thin film transistor and reduces a concentration of electric field lines in the channel region, thereby effectively reducing an off-state leakage current of the thin film transistor and improving an overall performance of the device.

DETAILED DESCRIPTION OF EMBODIMENTS

The following descriptions of the various embodiments refer to the accompanying figures to illustrate specific embodiments in which the present disclosure may be practiced.

With the continuous development of the display panel manufacturing technology, people have put forward higher requirements for the performance and display effect of the display panel and the display device.

The performance of a display device is closely related to a performance of its internal devices. In the prior art, when manufacturing a thin film transistor device in a display panel, the performance of the obtained thin film transistor is usually unsatisfactory, such as the on-state current and carrier mobility of the prepared thin film transistor are unsatisfactory, thereby reducing the quality and effect of the device, and are not conducive to the improvement of the comprehensive performance of the display device.

Embodiments of the present application provide an array substrate and a display panel, to effectively improve the structure of devices in the array substrate and improve an overall performance of the display panel.

Figure 1:
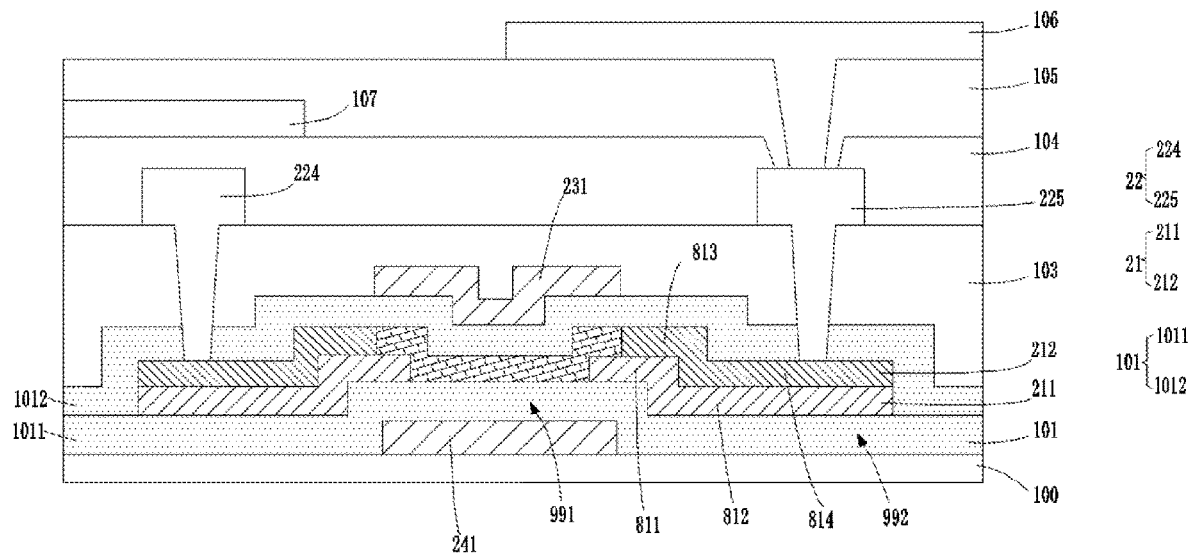
FIG. 1 is a schematic diagram of a film layer structure of an array substrate provided by one embodiment of the present application.

As shown in FIG. 1, FIG. 1 is a schematic diagram of a film layer structure of an array substrate provided by one embodiment of the present application. The structure of the array substrate provided in the embodiments of the present application is a multi-layer stack structure. Specifically, it includes: a substrate 100, an insulating medium layer 101, a light shielding layer 241, an active layer 21, a gate insulating layer 103, a source/drain metal layer 22, a planarization layer 104, a first pixel electrode 107, a passivation layer 105, and a second pixel electrode 106.

Specifically, the light shielding layer 241 is provided on the substrate 100, and the insulating medium layer 101 is provided on the substrate 100. Meanwhile, the insulating medium layer 101 completely covers the light shielding layer 241. In the embodiment of the present application, the light shielding layer 241 may be made of a metal material. For example, the light shielding layer 241 is configured as a plurality of signal lines, and the corresponding signal lines are used to shield light, thereby improving a layout of each device in the panel.

Meanwhile, the active layer 21 is disposed on the substrate 100, and the insulating medium layer 101 completely covers the active layer 21. For example, the active layer 21 is disposed inside the insulating medium layer 101. In the embodiment of the present application, the active layer 21 is arranged in a stepped structure inside the insulating medium layer 101. For example, two stepped structures with different heights are formed in the insulating medium layer 101. Through the step structure, an electric field strength of the corresponding drain can be effectively reduced, and a leakage current in the off-state can be reduced, thereby improving a performance of the device.

Specifically, in the embodiment of the present application, when the insulating medium layer 101 is disposed, the insulating medium layer 101 may be a whole, and when the insulating medium layer 101 is an integral film layer, the active layer 21 is directly disposed inside the insulating medium layer 101, and completely wraps the active layer 21. Please refer to the structure in FIG. 1 for details. In this case, an upper surface of the insulating medium layer 101 has different height differences in different regions, thereby the insulating medium layer 101 forms a plurality of steps in different regions. Through the plurality of steps, the arrangement of devices inside the array substrate is further improved, and a performance of the array substrate is improved.

In the embodiment of the present application, the insulating medium layer 101 may also be configured as a multi-layer structure, for example, the insulating medium layer 101 includes a first insulating medium layer 1011 and a second insulating medium layer 1012. The first insulating medium layer 1011 is disposed on the substrate 100, and the second insulating medium layer 1012 is disposed on the first insulating medium layer 1011. The active layer 21 is disposed between the first insulating medium layer 1011 and the second insulating medium layer 1012. A material of the first insulating medium layer 1011 may be different from a material of the second insulating medium layer 1012, and a film thickness of the second insulating medium layer 1012 is less than a film thickness of the first insulating medium layer 1011 when the insulating medium layer 101 is a multi-layer structure. Meanwhile, a height difference between the upper surface of the second insulating medium layer 1012 and the substrate 100 is different in different regions. Thus, a plurality of stepped structures are formed on the second insulating medium layer 1012 and the corresponding active layer 21, and the stacked structure of the stacked film layers in the array substrate is improved.

Further, in the embodiment of the present application, the gate electrode 231 is disposed on the active layer 21, the active layer 21 is positioned between the gate electrode 231 and the light shielding layer, the gate insulating layer 103 is disposed on the active layer 21, and at the same time, the gate insulating layer 103 completely covers the gate electrode 231. The gate electrode 231 is disposed corresponding to the light shielding layer 241, for example, the light shielding layer 241 is disposed in an orthographic projection region of the gate electrode 231 on the substrate 100. The gate electrode 231 and the light shielding layer 241 are both disposed at positions corresponding to a channel region of the active layer 21.

Figure 2:
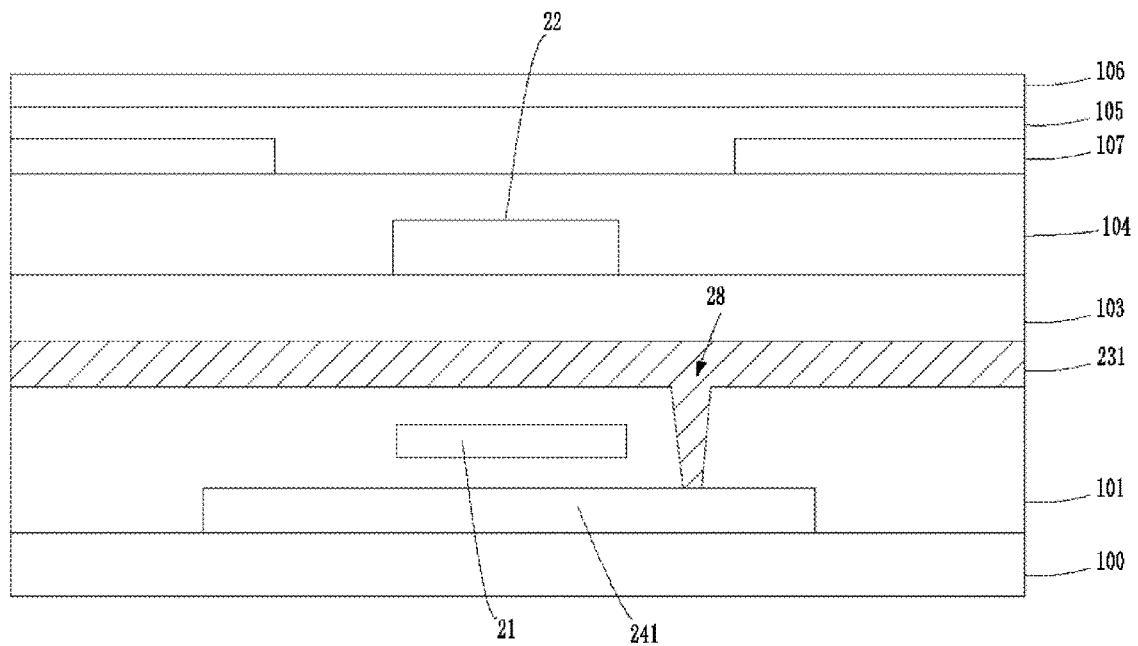
FIG. 2 is a schematic cross-sectional view of the array substrate in the figures provided by one embodiment of the present application.

As shown in FIG. 2, FIG. 2 is a schematic cross-sectional view of the array substrate in the figures provided in the embodiments of the present application. With reference to the film layer structure in FIG. 1, in the embodiment of the present application, a first through hole 28 is further provided in the array substrate. The first through hole 28 is disposed between the light shielding layer 241 and the gate electrode 231, such as at an edge of the light shielding layer 241, and the gate electrode 231 is electrically connected to the light shielding layer 241 through the first through hole 28. In this way, the gate electrode 231 and the light shielding layer 241 are formed and connected to each other, and the light shielding layer 241 can function as the gate electrode, such as forming a top-bottom double gate structure. Thus, an on-state current of the thin film transistor in the array substrate is further improved.

At the same time, the source/drain metal layer 22 is disposed on the gate insulating layer 103, and the source/drain metal layer 22 is electrically connected to the active layer 21 through corresponding through holes. For example, the source/drain metal layer 22 includes a source electrode 224 and a drain electrode 225 disposed on one side of the source electrode 224.

Further, the planarization layer 104 is disposed on the gate insulating layer 103, and the planarization layer 104 completely covers the source/drain metal layer 22, the first pixel electrode 107 disposed on the planarization layer 104, and the passivation layer 105 disposed on the planarization layer 104. The passivation layer 105 completely covers the first pixel electrode 107.

At the same time, the second pixel electrode 106 is disposed on the passivation layer 105, and the second pixel electrode 106 is electrically connected to the drain electrode 225 of the thin film transistor in the array substrate through the through hole structure. In the embodiment of the present application, the first pixel electrode 107 and the second pixel electrode 106 can be made of a same material, such as indium tin oxide. The first pixel electrode 107 is patterned on the planarization layer 104.

Figure 3:
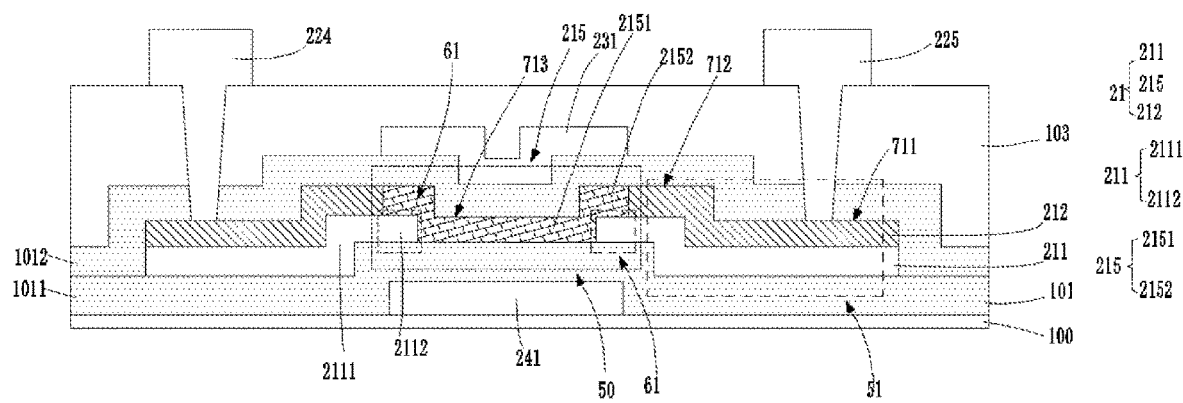
FIG. 3 is a schematic diagram of a portion of the film layer structure in the array substrate provided by one embodiment of the present application.

As shown in FIG. 3, FIG. 3 is a schematic diagram of a portion of the film layer structure in the array substrate provided by the embodiment of the present application. In the embodiment of the present application, the active layer 21 is arranged in a stacked structure of multiple layers when the active layer 21 is arranged. In the following embodiments, the active layer 21 includes a channel portion and doped portions disposed on both sides of the channel portion.

Specifically, the doped portion is described by taking the first doped layer 211 and the second doped layer 212 as examples. Meanwhile, the channel portion is described by taking the first channel portion 2151 and the second channel portion 2152 as examples.

Specifically, the first doped layer 211 is disposed on the first insulating medium layer 1011, the second doped layer 212 is disposed on the first doped layer 211, and the second insulating medium layer 1012 covers the second doped layer 212.

The active layer 21 includes doped regions 51 and a channel region 50. The doped regions 51 are provided on both sides of the channel region 50. Preferably, the two doped regions 51 on both sides of the channel region 50 may be symmetrically arranged relative to the channel region 50. Meanwhile, the channel portion is correspondingly disposed in the channel region 50.

In the embodiment of the present application, the first doped layers 211 are correspondingly disposed at least in the doped regions 51 on both sides, and the first doped layers 211 are provided discontinuously at least in the channel region 50. Preferably, the first doped layers 211 are close to an edge of one side of the channel region 50 and extends into the channel region 50.

At the same time, the channel layer 215 is correspondingly disposed in the channel region 50, and the second doped layers 212 are disposed on both sides of the channel layer 215 and forms a continuous film structure with the channel layer 215.

Further, an edge of the first doped layer 211 on a side away from the channel region 50 and an edge of the second doped layer 212 on a side away from the channel region 50 are flush when the first doped layer 211 and the second doped layer 212 are arranged.

In the embodiment of the present application, the doped region of the first doped layer 211 is disposed correspondingly to the doped region of the second doped layer 212. For example, the doped region of the second doped layer 212 is disposed on the doped region of the first doped layer 211. An orthographic projection of the doped region of the second doped layer 212 on the substrate is positioned within an orthographic projection of the doped region of the first doped layer 211 on the substrate.

Specifically, the doped region of the first doped layer 211 is close to an edge of one side of the channel region 50, extends into the channel region 50, and is at least partially stacked with the channel layer in the channel region 50. Thus, the first doped layer and the channel layer form a stacked structure, such as a stacked stepped structure. At a corresponding position of the step structure, the film layer extending from the first doped layer to the channel region is connected with the channel layer, so as to realize the transport of carriers in different doped layers of the active layer.

In the embodiment of the present application, the first doped layer 211 includes a stacked portion 2111 and an extension portion 2112, and the stacked portion 2111 is connected to the extension portion 2112. The stacked portion 2111 is disposed in the doped region 51, and the extension portion 2112 is disposed in the channel region 50. Since the extension portion 2112 extends into the channel region 50, a step structure 61 is formed between the extension portion 2112 and the corresponding film layer in the doped region 51 of the second doped layer 212. The step structure 61 is used to improve the electric field distribution in the active layer, such as reducing a concentration of electric field lines in this region, and effectively reducing an off-state leakage current of the thin film transistor.

Specifically, in the region corresponding to the edge of the extension portion 2112, the first doped layer 211 is disconnected and the channel layer 215 is continuously arranged in the channel region, so that the channel layer 215 can be filled with a disconnection space between the first doped layers 211.

Further, in the embodiment of the present application, the channel layer 215 may include a first channel portion 2151 and a second channel portion 2152. One terminal of the second channel portion 2152 is connected to the first channel portion 2151, and the other terminal of the second channel portion 2152 is electrically connected to the second doped layer 212.

Specifically, the first channel portion 2151 is connected to the first doped layer 211, the second channel portion 2152 is connected to the second doped layer 212, and a portion of the second channel portion 2152 is overlapped to a portion of the first doped layer 211.

Specifically, the first channel portion 2151 can be correspondingly disposed within an interval formed by the first doped layer 211, and the second channel portion 2152 can be disposed on the extension portion 2112 and completely cover the extension portion 2112. Therefore, the second channel portion 2152 and the extension portion 2112 of the first doped layer 211 form a stacked structure.

In the embodiment of the present application, a thickness of the first channel portion 2151 may be the same as a thickness of the first doped layer 211, and at the same time, the thickness of the first channel portion 2151 and a thickness of the second channel portion 2152 are the same. Thereby ensuring a connection and alignment between the film layers.

At the same time, in the embodiment of the present application, a length of the first channel portion 2151 may be greater than a length of the second channel portion 2152. Moreover, a length of the extension portion 2112 positioned on either side of the first channel portion 2151 is less than a length of the corresponding second channel portion 2152.

Further, a length of the first doped layer 211 is less than a length of the second doped layer 212, and a thickness of one terminal of the first doped layer close to the first channel portion is equal to a thickness of the first channel portion. A thickness of one terminal of the second doped layer close to the second channel portion is equal to a thickness of the second channel portion.

Further, since the first doped layer 211 and the second doped layer 212 are symmetrically disposed with respect to the channel region 50, the extension lengths and thicknesses of the two extension portions 2112 on both sides of the channel region 50 are the same. In the embodiment of the present application, in the channel region 50, the second doped layer 212 fills a disconnected region of the first doped layer 211, and in the channel region 50, the channel portion is set to be a concave structure. Both terminals of the concave structure are in contact with the edge step structure of the first doped layer 211. Thus, the film layer of the first doped layer 211 in the channel region is in contact with the film layer of the second doped layer 212 in the channel region.

Preferably, in the embodiment of the present application, a height of the stepped structure 61 is the thickness of the extension portion 2112. At a position corresponding to the stepped structure 61, the extension portion 2112 extends beyond the second doped layer 212 and is connected to the first channel portion 2151. At the same time, the extension portion and the second channel portion 2152 are overlapped, and the second channel portion 2152 has not undergone doping treatment, thereby reducing an electric field intensity in the second channel region 2152, thereby effectively improving an electric field distribution in the active layer, and improving device performance.

In the embodiment of the present application, the thickness of the stacked portion 2111 of the first doped layer 211 is the same as the thickness of the extension portion 2112. Meanwhile, the thickness of the first doped layer 211 and the thickness of the second doped layer 212 can also be set to the same thickness, or according to an actual product, the first doped layer 211 and the second doped layer 212 can be set for different thicknesses.

The thicknesses of the first doped layer 211 and the second doped layer 212 are the same, wherein the thickness may be set to range from 400 angstroms to 500 angstroms, preferably, 450 angstroms.

At the same time, in order to improve a performance of the thin film transistor, in the embodiment of the present application, the extension length of the extension portion 2112 of the first doped layer 211 can be set to ranges from 0.5 um to 1 um. Preferably, the length of the extension portion 2112 is set to 1 um. Therefore, the extension portion 2112 achieves the best effect.

Further, with reference to the film layer structure in FIG. 1, in the embodiment of the present application, the first doped layer 211 further includes a first sublayer 811 and a second sublayer 812, wherein the first sublayer 811 and the second sublayer 812 are connected. At the same time, the first sublayer 811 is close to a side of the channel portion, and the second sublayer 812 is away from a side of the channel portion.

Meanwhile, the second doped layer 212 includes a third sublayer 813 close to the channel portion and a fourth sublayer 814 away from the channel portion. The third sublayer 813 is connected to the fourth sublayer 814. The third sublayer 813 partially overlaps the first sublayer 811, and the fourth sublayer 814 partially overlaps the second sublayer 812. A distance between the first sublayer 811 and the substrate is greater than a distance between the second sublayer and the substrate. A distance between the third sublayer 813 and the substrate is greater than a distance between the fourth sublayer 814 and the substrate. At this time, a Z-shaped structure is formed between the first sublayer 811 and the second sublayer 812, and a Z-shaped structure is formed between the third sublayer 813 and the fourth sublayer 814.

In the embodiment of the present application, the thicknesses of the first sublayer and the second sublayer are the same, and the thicknesses of the third sublayer and the fourth sublayer are the same.

Further, the array substrate further includes an insulating medium layer 101. The active layer 21 in the embodiment of the present application is disposed in the insulating medium layer 101 and is wrapped by the insulating medium layer 101. In the embodiment of the present application, the insulating medium layer 101 includes a protruded raised portion 991 and flat portions 992 disposed on both sides of the raised portion. The raised portion 991 and the flat portion 992 are both disposed on the substrate, and the raised portion 991 covers the light shielding layer. At the same time, a distance between the raised portion 991 and the substrate is greater than a distance between the flat portion 992 and the substrate.

Further, the first sublayer 811 is arranged to overlap with the raised portion 991, and the second sublayer 812 is arranged to overlap with the flat portion 992.

Specifically, the channel portion is correspondingly disposed on the raised portion 991, and at the same time, the doped portion is correspondingly disposed on the flat portions 992. The first doped layer 211 is disposed on the flat portion 992, and at the same time, part of the first doped layer 211 is disposed on the raised portion 991. Thus, the doped portion forms a Z-shaped structure.

In the embodiment of the present application, a height of the raised portion 991 is the same as the thickness of the first doped layer 211.

Further, in the embodiment of the present application, the film thickness of the second doped layer 212 in different regions can be set to be a same thickness. At the same time, since the film layers are arranged in a stacked structure, different stepped surfaces are formed on the respective surfaces of the first doped layer 211 and the second doped layer 212.

In the embodiment of the present application, the stepped surface is described by taking the first stepped surface 711, the second stepped surface 712, and the third stepped surface 713 as examples. The first stepped surface 711 is disposed in the doped region 51, the second stepped surface 712 is disposed in the doped region 51 and the channel region 50, and the third stepped surface 713 is disposed in the channel region 50.

The first stepped surface 711 is disposed at a position close to an outer side of the doped region 51, and the second stepped surface 712 is disposed at one side close to the channel region 50. The second stepped surface 712 extends into the channel region. A height between the first step surface 711 and the substrate is less than a height between the second step surface 712 and the substrate. That is, a height of the second stepped surface 712 is greater than a height of the first stepped surface 711. Specifically, a height difference between the first stepped surface 711 and the second stepped surface 712 may be ranges from 500 angstroms to 1000 angstroms. Correspondingly, a corresponding stepped surface is also formed at the film layer between the first doped layer 211 and the second doped layer 212, as shown in FIG. 3, and details are not repeated here.

Meanwhile, a height difference between the first stepped surface 711 and the second stepped surface 712 may be the same as a height of the stepped structure 61. Moreover, the source electrode 224 and the drain electrode 225 are electrically connected to the second stepped surface of the second doped layer 212 through corresponding through holes, to realize a transmission and control of the signal.

Further, in the embodiment of the present application, a length corresponding to the first stepped surface 711 is L1, a length corresponding to the second stepped surface 712 is L2, and a length corresponding to the third stepped surface 713 is L3. A length of the first stepped surface 711 is greater than a length of the second stepped surface 712. Preferably, the length of the first stepped surface 711 ranges from 2.5 um to 3.5 um, and at the same time, the length of the second stepped surface 712 ranges from 1 um to 2 um. In the embodiment of the present application, during manufacturing, the length of the first stepped surface 711 is set to 3 um, and the length of the second stepped surface 712 is set to 1.5 um.

At the same time, the second step surface 712 extends into the channel region 50, and the length in the channel region 50 is smaller than the corresponding length in the doped region 51. In the embodiment of the present application, the third stepped surface 713 and the first stepped surface 711 may be positioned in a same horizontal plane.

In the embodiment of the present application, the gate electrode 231 is correspondingly disposed on the channel region 50, and the gate electrode 231 forms a concave step structure. At the same time, an orthographic projection of the gate electrode 231 on the substrate at least partially coincides with an orthographic projection of the first doped layer 211 on the substrate.

Specifically, one side edge of the orthographic projection of the gate electrode 231 on the active layer coincides with the one side edge of the second doped layer 212 close to the second channel portion.

Further, in the embodiment of the present application, the film layer corresponding to the first doped layer 211 is only a lightly doped region, and the film layer in the doped region 51 corresponding to the second doped layer 212 is a heavily doped region. Thereby, the heavily doped region and the lightly doped region of the active layer 21 are formed. A length of the heavily doped region of the second doped layer is shorter than a length of the lightly doped region of the first doped layer.

Preferably, in the embodiment of the present application, both the heavily doped region and the lightly doped region are doped with P+ ions, and the lightly doped regions corresponding to both sides of the channel region 50 have a same doped concentration, and the doping concentrations of the corresponding heavily doped regions on both sides of the channel region 50 are the same. In the lightly doped region, an ion concentration of its doped is $1\times10^{13}/cm^2$, and when doped it, a provided doped energy is 70 keV; in the heavily doped region, the ion concentration of its doped is $3.5\times10^{14}/cm^2$, and a provided doping energy is 70 keV.

Figure 4:
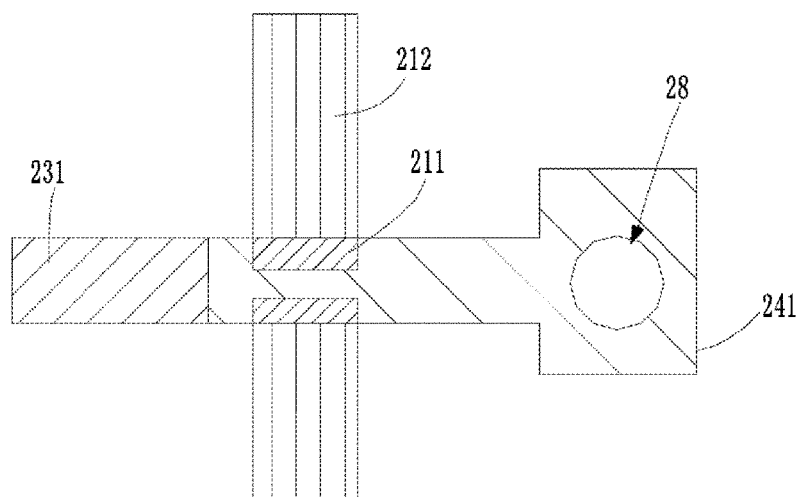
FIG. 4 is a schematic diagram of the wiring of each film layer provided by one embodiment of the present application.

As shown in FIG. 4, FIG. 4 is a schematic diagram of wiring of each film layer provided in the embodiment of the present application. Combined with the film structure in FIGS. 1 to 3, the positional relationship between the first doped layer 211, the second doped layer 212, the gate electrode 231, and the light shielding layer 241 is shown in the figure, wherein the light shielding layer 241 is electrically connected to the gate electrode 231 through the first through hole 28.

Further, the embodiments of the present application also provide a method of manufacturing an array substrate. As shown in FIG. 5 to FIG. 13, FIG. 5 to FIG. 13 are schematic diagrams of film layer structures corresponding to the manufacturing process provided in the embodiments of the present application.

Figure 5:
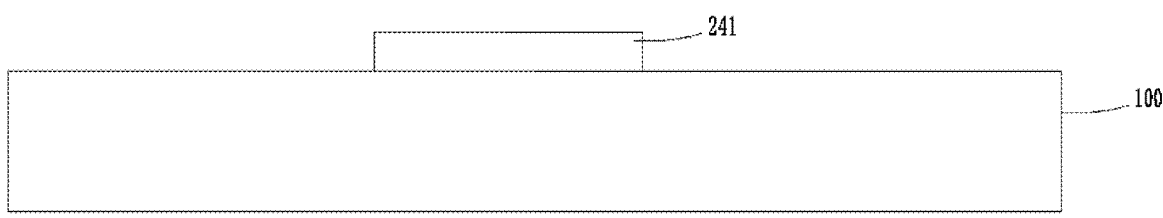
FIGS. 5 to 13 are schematic diagrams of a structure of the film layers corresponding to a manufacturing process provided in the embodiments of the present application.
Figure 6:
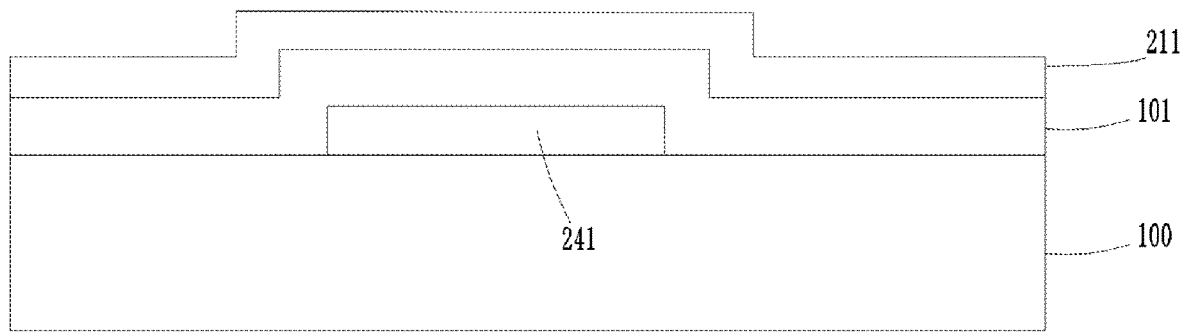

Referring to FIG. 5 for details, a substrate 100 is provided, and a light shielding layer 241 is formed on the substrate 100. The light shielding layer 241 is a metal light shielding layer.

At the same time, an insulating medium layer 101 is formed on the light shielding layer 241, and the insulating medium layer 101 completely covers the light shielding layer 241. At the same time, a part of the active layer is manufacturing on the insulating medium layer 101. Specifically, the first doped layer 211 is manufactured on the insulating medium layer 101.

Figure 7:
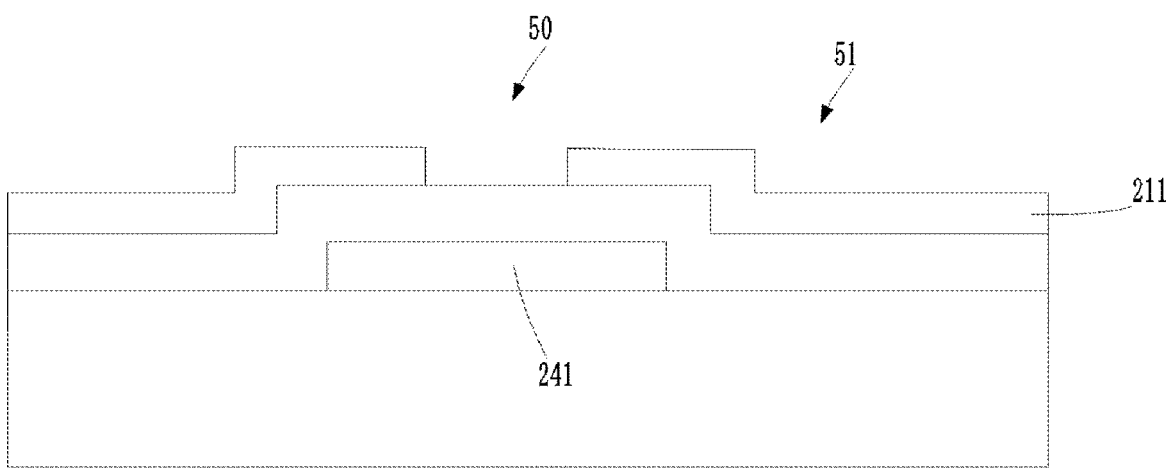

Referring to FIG. 7 for details, after the first doped layer 211 is manufactured, it is subjected to etching treatment. The first doped layer 211 is disconnected at a position corresponding to the light shielding layer 241 to form a space. After the etching is completed, doped treatment is performed. Specifically, in the doped region 51, the first doped layer 211 is lightly doped with P+ ions. And when it is doped, its ion concentration is $1\times10^{13}/cm^2$, and when it is doped, the provided doped energy is 70 keV. Finally, the doped region 51 and the channel region 50 are formed.

Figure 8:
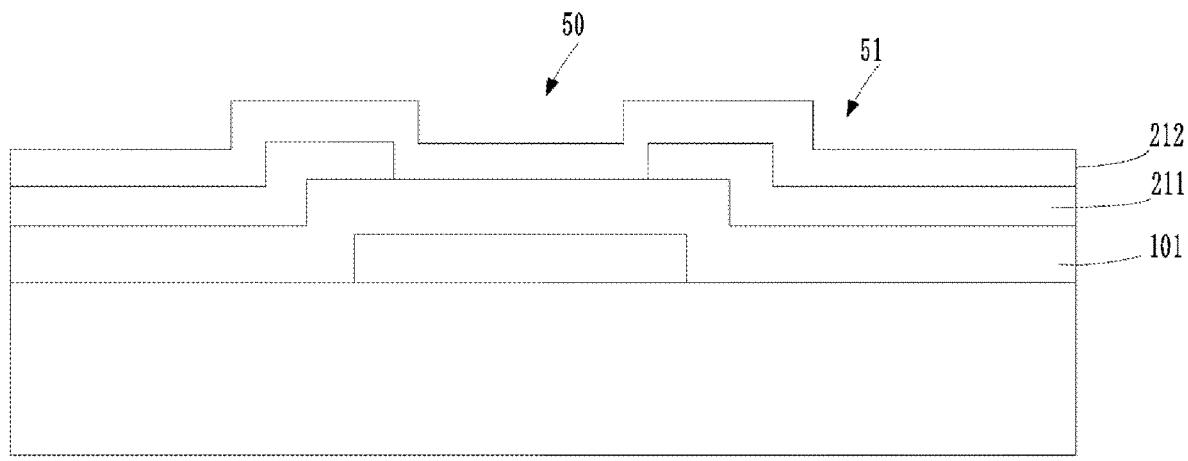

Referring to FIG. 8, a second doped layer 212 is manufactured on the first doped layer 211, the second doped layer 212 is continuously disposed in the first doped layer 211, and the second doped layer 212 is filled in the channel region corresponding to the first doped layer 211. Since the array substrate is a multi-layer stack structure, the second doped layer 212 and the corresponding first doped layer 211 form different stepped structures at different positions.

Figure 9:
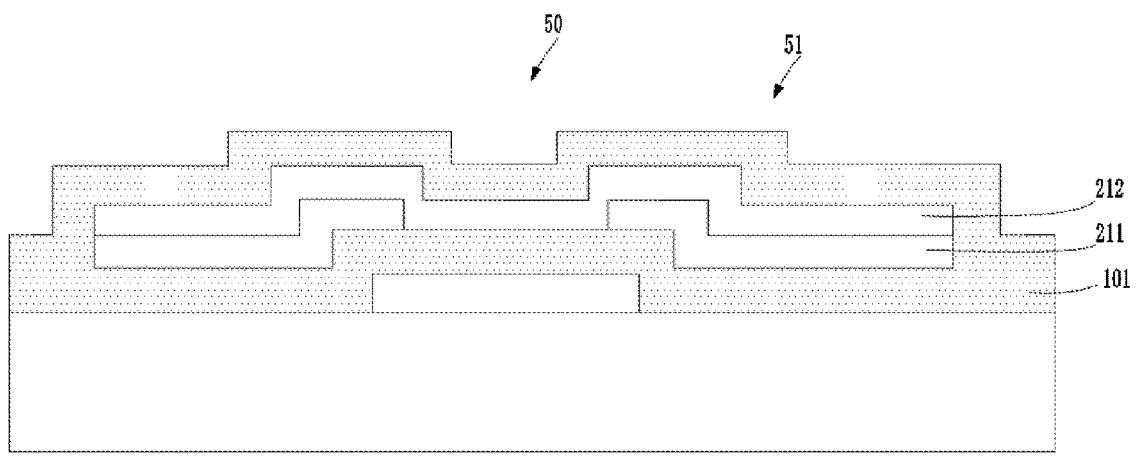

Referring to FIG. 9 for details, after the manufacturing of the second doped layer 212 is completed, another insulating medium layer 101 is manufactured, and the active layer 21 is completely wrapped by the insulating medium layer 101. In the embodiment of the present application, the insulating medium layer 101 may be formed with different heights in different regions when the insulating medium layer 101 is manufactured and formed. The heights of the steps corresponding to the different positions can be set according to the specifications of the actual product.

Figure 10:
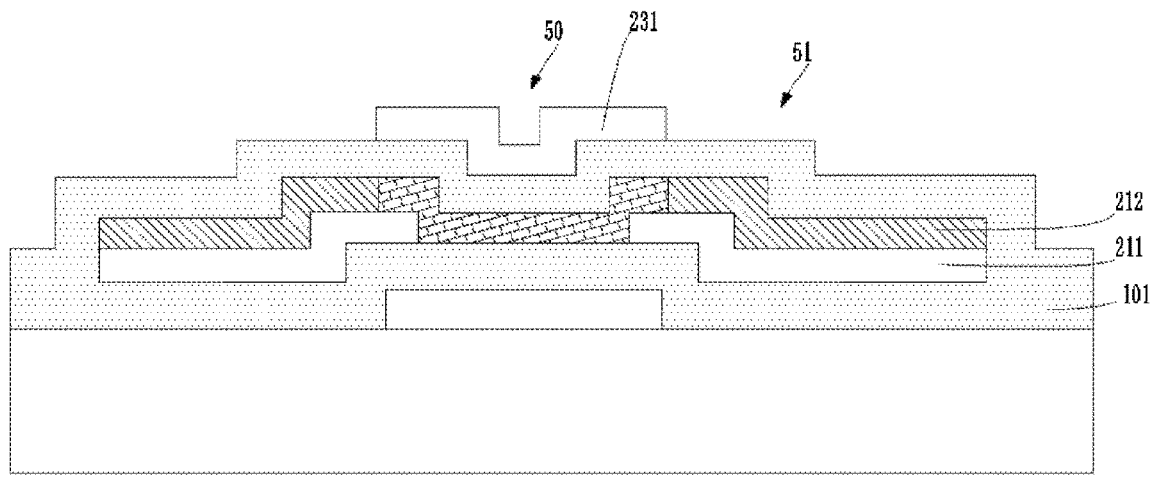

Further, referring to FIG. 10 for details, after the manufacturing of the insulating medium layer 101 is completed, a gate electrode 231 is continued to be formed on the insulating medium layer 101. In the embodiment of the present application, the gate electrode 231 is disposed at a position corresponding to the channel region.

At the same time, after the gate electrode 231 is manufactured, the second doped layer 212 is doped. Specifically, in the doped region 51, the second doped layers 212 on both sides of the channel region 50 are doped. Due to the shielding of the gate electrode 231, the second doped layer 212 cannot be ion-doped in the channel region 50, and a corresponding region in this region is the channel portion of the active layer. After the treatment is completed, the second doped layer 212 forms a doped region 51 and a channel region 50.

In the embodiment of the present application, the doped region 51 corresponding to the second doped layer 212 is a heavily doped region. Specifically, in the heavily doped region, an ion concentration of the doped is $3.5\times10^{14}/cm^2$, and the provided doped energy is 70 keV. After the doped is completed, the film layer structure shown in FIG. 9 is finally formed.

Figure 11:
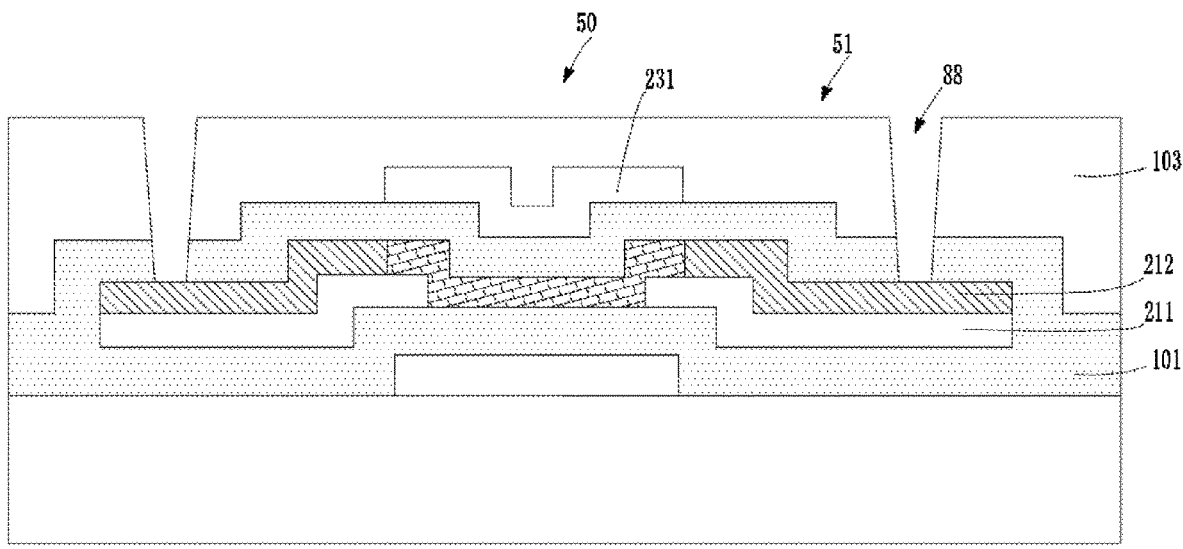

Referring to FIG. 11, after the doped treatment of the second doped layer 212 is completed, a gate insulating layer 103 is manufactured on the insulating medium layer 101. The gate insulating layer 103 completely covers the gate electrode 231. At the same time, a top surface of the gate insulating layer 103 is a flat surface for subsequent manufacturing of other film layers.

After the gate insulating layer 103 is manufactured, an etching process is performed, and a through hole 88 is formed in the gate insulating layer 103, wherein the through hole 88 is disposed at the position where the first doped layer 211 and the second doped layer 212 are stacked. At the same time, the through hole 88 exposes a part of a surface of the second doped layer 212.

Figure 12:
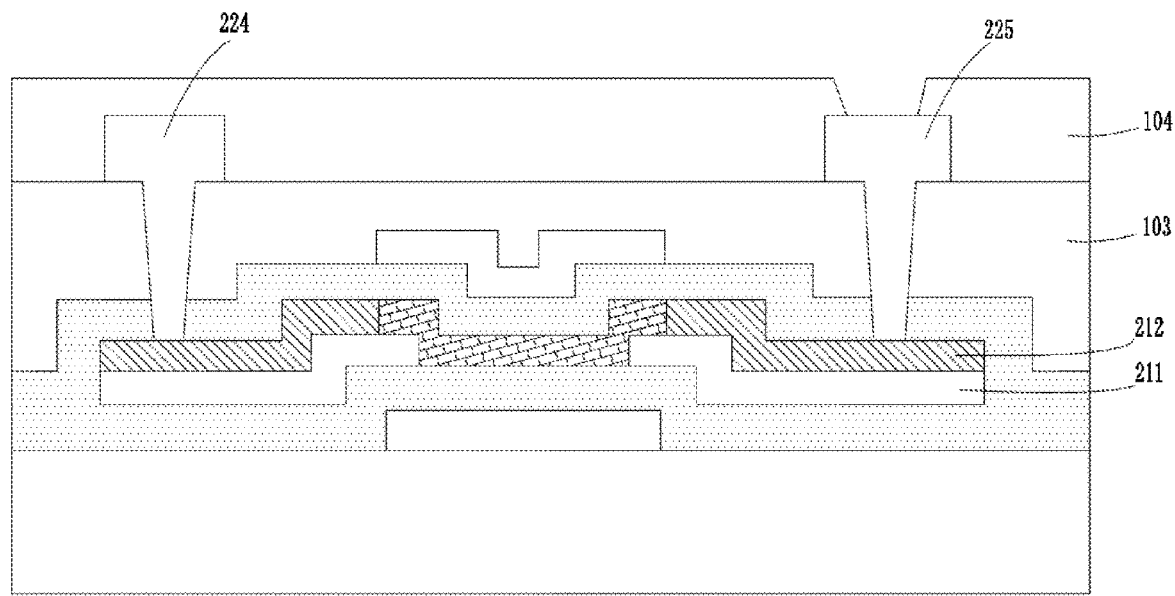

Referring to FIG. 12 for details, after the etching of the through hole 88 is completed, a source/drain metal layer is manufactured on the gate insulating layer 103. Specifically, the source electrode 224 and the drain electrode 225 are respectively manufactured at the position of the corresponding through hole 88, and the source electrode 224 and the drain electrode 225 are electrically connected to the second doped layer 212 through the through hole 88.

After the source/drain metal layers are manufactured, a planarization layer 104 is formed on the gate insulating layer 103. In the embodiment of the present application, the planarization layer 104 completely covers the source/drain metal layer. At the same time, etching is performed at the corresponding position of the source/drain metal layer, and another through hole is formed, and part of the source/drain metal layer is exposed through the through hole.

Figure 13:
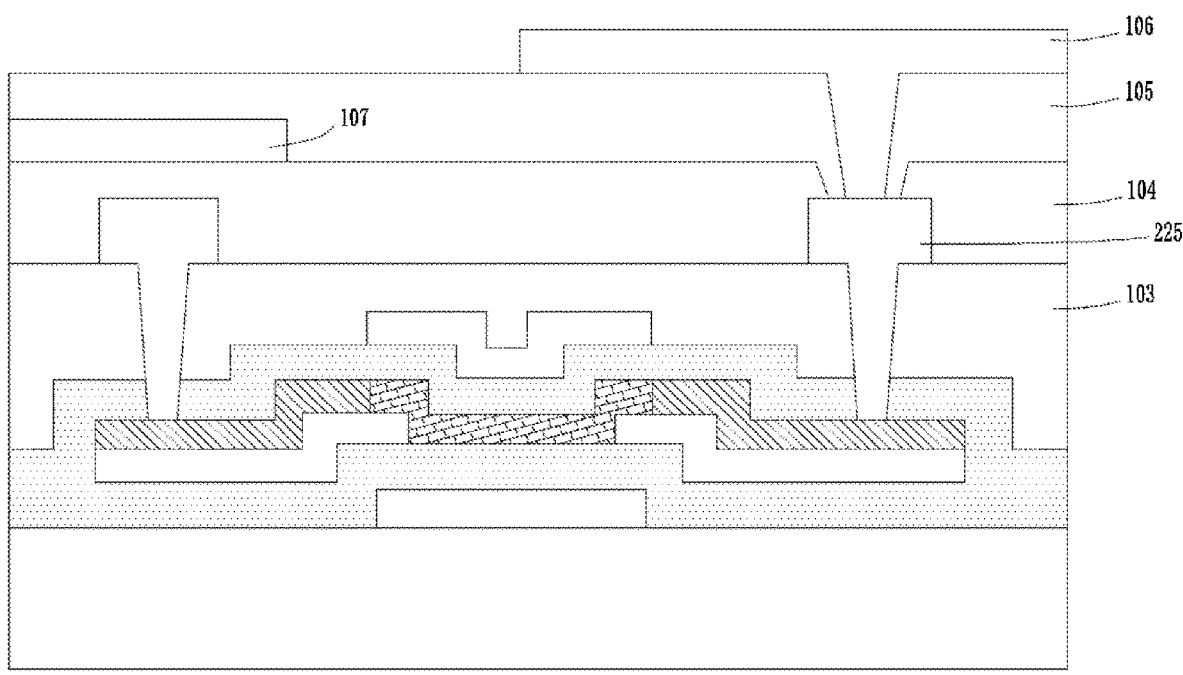

Referring to FIG. 13 for details, in the embodiment of the present application, the first pixel electrode 107 is manufactured on the planarization layer 104. The first pixel electrode 107 can be disposed on one side of the planarization layer 104, and at the same time, a passivation layer 105 is manufactured on the first planarization layer 104. The passivation layer 105 completely covers the first pixel electrode 107.

After the first pixel electrode 107 and the passivation layer 105 are manufactured, the positions corresponding to the passivation layer 105 and the drain electrode 225 are etched again to form a through hole structure.

Further, a second pixel electrode 106 is manufactured on the passivation layer 105. In the embodiment of the present application, the second pixel electrode 106 is disposed on the drain electrode 225, and the second pixel electrode 106 is electrically connected to the drain electrode 225 through the through hole. The materials of the first pixel electrode 107 and the second pixel electrode 106 may be the same, such as indium tin oxide material. Therefore, the control signal is increased to the corresponding pixel electrode through the thin film transistor in the array substrate.

Further, after the above-mentioned film layers are manufactured, other film layers, such as light-emitting layer, encapsulating layer and other functional film layers, are manufactured on the second pixel electrode layer 106, and finally the display panel provided in the embodiments of the present application is manufactured.

In the embodiment of the present application, the active layer of the thin film transistor in the array substrate has a stepped structure, and the first doped layer 211 and the second doped layer 212 form a stepped structure in the channel region. The electric field is redistributed, thereby effectively reducing the corresponding off-state leakage current of the device. At the same time, the film thickness of the corresponding second doped layer 212 in the channel region at the edge is larger than the film thickness of the corresponding second doped layer 212 in the middle region, thereby effectively reducing the electric field superposition effect of the double gate structure and improving a mobility of carriers, effectively improve an overall performance of the display panel.

The display panel can be any product or component with display function and touch function, such as mobile phone, computer, electronic paper, monitor, notebook computer, digital photo frame, etc., and its specific type is not specifically limited.

To sum up, an array substrate and a display panel provided by the embodiments of the present application have been described in detail above. The principles and implementations of the present application are described with specific examples in the specification. The descriptions of the above embodiments are only used to help understand the technical solutions and core ideas of the present invention. Although the present application is disclosed above with preferred embodiments, the above preferred embodiments are not intended to limit the present application. Various changes and modifications can be made without departing from the spirit and scope of the present application. Therefore, a protection scope of the present application is based on a scope defined by the claims.

What is claimed is:

1. An array substrate, comprising:
a substrate;
an active layer disposed on the substrate, wherein the active layer comprises a channel portion and doped portions disposed on two sides of the channel portion;
wherein the doped portion comprises a first doped layer and a second doped layer, wherein the second doped layer is positioned on the first doped layer and overlaps with the first doped layer;
wherein the channel portion comprises a first channel portion, and a second channel portion positioned on the first channel portion and connected to the first channel portion, wherein the first channel portion is connected to the first doped layer, wherein the second channel portion is connected to the second doped layer, and wherein an orthogonal projection of a part of the second channel portion on the substrate overlaps with an orthogonal projection of a part of the first doped layer on the substrate, and the second channel portion contacts the first doped layer and the second doped layer separately; and
wherein a length of the first channel portion is longer than a length of the second channel portion;
wherein the second doped layer comprises a third sublayer close to the channel portion, and a fourth sublayer relatively far from the channel portion, wherein the third sublayer is connected to the fourth sublayer, and wherein a distance between the third sublayer and the substrate is greater than a distance between the fourth sublayer and the substrate.

2. The array substrate according to claim 1, wherein an edge of the first doped layer on a side away from the channel portion and an edge of the second doped layer on a side away from the channel portion are flush, and wherein a length of the first doped layer is greater than a length of the second doped layer.

3. An array substrate, comprising:
a substrate;
an active layer disposed on the substrate, wherein the active layer comprises a channel portion and doped portions disposed on two sides of the channel portion;
wherein the doped portion comprises a first doped layer and a second doped layer, wherein the second doped layer is positioned on the first doped layer and overlaps with the first doped layer; and
wherein the channel portion comprises a first channel portion, and a second channel portion positioned on the first channel portion and connected to the first channel portion, wherein the first channel portion is connected to the first doped layer, wherein the second channel portion is connected to the second doped layer, and wherein a part of the second channel portion overlaps with a part of the first doped layer;
wherein the first doped layer comprises a first sublayer close to the channel portion, and a second sublayer relatively far from the channel portion, wherein the first sublayer is connected to the second sublayer, and wherein a distance between the first sublayer and the substrate is greater than a distance between the second sublayer and the substrate; and
wherein the second doped layer comprises a third sublayer close to the channel portion, and a fourth sublayer relatively far from the channel portion, wherein the third sublayer is connected to the fourth sublayer, and wherein a distance between the third sublayer and the substrate is greater than a distance between the fourth sublayer and the substrate.

4. The array substrate according to claim 3, wherein an edge of the first doped layer on a side away from the channel portion and an edge of the second doped layer on a side away from the channel portion are flush, and wherein a length of the first doped layer is greater than a length of the second doped layer.

5. The array substrate according to claim 4, wherein a side edge of the first doped layer close to the channel portion is connected to the first channel portion and the second channel portion.

6. The array substrate according to claim 5, wherein a thickness of a film corresponding to the first channel portion is the same as a thickness of a film corresponding to the second channel portion.

7. The array substrate according to claim 6, wherein a thickness of one terminal of the first doped layer close to the first channel portion is equal to a thickness of the first channel portion, and wherein a thickness of one terminal of the second doped layer close to the second channel portion is equal to a thickness of the second channel portion.

8. The array substrate according to claim 3, wherein the first doped layer comprises a stacked portion and an extension portion connected to the stacked portion, wherein the stacked portion overlaps with the second doped layer, and wherein the extension portion extends beyond the second doped layer and is connected to the first channel portion, and wherein the extension portion is disposed overlapping with the second channel portion.

9. The array substrate according to claim 8, wherein the lengths of the extension portions positioned on both sides of the first channel portion are the same.

10. The array substrate according to claim 8, wherein a length of the extension portion positioned on either side of the first channel portion is smaller than a length of a corresponding second channel portion.

11. The array substrate according to claim 8, wherein a length of the extension portion positioned on either side of the first channel portion ranges from 0.5 um to 1 um.

12. The array substrate according to claim 3, wherein the third sublayer partially overlaps the first sublayer, wherein the fourth sublayer partially overlaps the second sublayer.

13. The array substrate according to claim 12, wherein a thickness of the first sublayer is the same as a thickness of the second sublayer, and wherein a thickness of the third sublayer is the same as a thickness of the fourth sublayer.

14. The array substrate according to claim 3, wherein the array substrate further comprises a light shielding layer disposed on the substrate, and an insulating medium layer disposed on the substrate and covering the light shielding layer, wherein the light shielding layer and the insulating medium layer are both positioned between the substrate and the active layer;
wherein the insulating medium layer comprises a raised portion on the light shielding layer, and a flat portion connected to the raised portion, and wherein a distance between the raised portion and the substrate is greater than a distance between the flat portion and the substrate; and
wherein the first sublayer is arranged to overlap with the raised portion, and wherein the second sublayer is arranged to overlap with the flat portion.

15. The array substrate according to claim 14, wherein the array substrate further comprises:
a gate electrode disposed on the active layer; and,
a source/drain metal layer disposed on the gate electrode and is electrically connected to the active layer, and wherein the light shielding layer is also electrically connected to the gate electrode through a through hole.

16. The array substrate according to claim 15, wherein the gate electrode is correspondingly disposed on the channel portion of the active layer, and wherein an orthographic projection of the gate electrode on the substrate is at least coinciding with an orthographic projection of the first doped layer on the substrate.

17. The array substrate according to claim 16, wherein a side edge of the orthographic projection of the gate electrode on the active layer coincides with a side edge of the second doped layer close to the second channel portion.

18. The array substrate according to claim 3, wherein the first doped layer is a lightly doped layer, and wherein the second doped layer is a heavily doped layer.

19. A display panel, wherein the display panel comprises the array substrate, and wherein the array substrate comprises:
a substrate;
an active layer disposed on the substrate, wherein the active layer comprises a channel portion and doped portions disposed on two sides of the channel portion;
wherein the doped portion comprises a first doped layer and a second doped layer, wherein the second doped layer is positioned on the first doped layer and overlaps with the first doped layer; and
wherein the channel portion comprises a first channel portion, and a second channel portion positioned on the first channel portion and connected to the first channel portion, wherein the first channel portion is connected to the first doped layer, wherein the second channel portion is connected to the second doped layer, and wherein a part of the second channel portion overlaps with a part of the first doped layer;
wherein the second doped layer comprises a third sublayer close to the channel portion, and a fourth sublayer relatively far from the channel portion, wherein the third sublayer is connected to the fourth sublayer, and wherein a distance between the third sublayer and the substrate is greater than a distance between the fourth sublayer and the substrate.

* * * * *